(12) United States Patent  (10) Patent No.: US 8,803,598 B2
Sato  (45) Date of Patent: Aug. 12, 2014

(54) SOLID-STATE IMAGING DEVICE

(71) Applicant: Kabushiki Kaisha Toshiba, Tokyo (JP)

(72) Inventor: Eiji Sato, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/773,318

(22) Filed: Feb. 21, 2013

(65) Prior Publication Data

US 2014/0015600 A1   Jan. 16, 2014

(30) Foreign Application Priority Data

Jul. 12, 2012  (JP) ................................. 2012-156708

(51) Int. Cl.
*H01L 25/00*   (2006.01)
(52) U.S. Cl.
USPC .......................................... 327/565; 327/515
(58) Field of Classification Search
CPC ................................................ H01L 27/14636
USPC .......................... 327/514, 515, 534, 564, 565
See application file for complete search history.

(56) References Cited

U.S. PATENT DOCUMENTS

| 8,405,016 B2* | 3/2013 | Oshiyama et al. .......... 250/208.1 |
| 8,653,620 B2* | 2/2014 | Sato .............................. 257/460 |
| 8,669,602 B2* | 3/2014 | Hayashi ........................ 257/292 |
| 2010/0059865 A1 | 3/2010 | Low et al. |
| 2011/0084365 A1 | 4/2011 | Law et al. |

FOREIGN PATENT DOCUMENTS

| JP | 2010-287859 | 12/2010 |
| JP | 2011-082524 A | 4/2011 |

* cited by examiner

*Primary Examiner* — Jeffrey Zweizig
(74) *Attorney, Agent, or Firm* — Patterson & Sheridan, LLP

(57) ABSTRACT

A semiconductor element layer has a pixel region in which a plurality of photodiodes are provided and a peripheral circuit region in which a peripheral circuit for processing the device is provided, a power supply line to supply an electric power to the peripheral circuit, provided at a first side of the semiconductor element layer in the peripheral circuit region, a first wiring layer to supply the electric power to the power supply line, provided at a second side of the semiconductor element layer in the peripheral circuit region, and a plurality of first through-electrodes, provided in the peripheral circuit region and passing through the semiconductor element layer between the first side and the second side. At least a part of the first through-electrodes electrically connect between the power supply line and the first wiring layer.

15 Claims, 10 Drawing Sheets

SOLID-STATE IMAGING DEVICE

CROSS-REFERENCE TO RELATED APPLICATION

This application is based upon and claims the benefit of priority from Japanese Patent Application No. 2012-156708, filed Jul. 12, 2012; the entire contents of which are incorporated herein by reference.

FIELD

Embodiments described herein relate to a solid-state imaging device.

BACKGROUND

Solid-state imaging devices such as CCD image sensors and CMOS image sensors, and the like have, been used in various areas such as digital cameras, video cameras, and surveillance cameras, and the like. In solid-state imaging devices, a back-illuminated type structure has been used, in part, to ensure that a sufficient quantity of an incident light reaches the photodiodes, as pixel size of the imaging devices decrease.

To supply electric power to an analog circuit and a logic circuit in a solid-state imaging device, a power supply line provided on the surface of a semiconductor substrate from a power supply pad provided on the rear surface of a semiconductor substrate by an electrode which passes through the semiconductor substrate; furthermore, the power is supplied from the power supply line to the analog circuit and the logic circuit. Thus, if a power supply pad is arranged at a chip end, voltage will drop at the central region of the chip because that portion of the chip is relatively distant from the power source. Accordingly, it is difficult to supply a stable power to the entire analog circuit the logic circuit.

DETAILED DESCRIPTION

Figure 1:
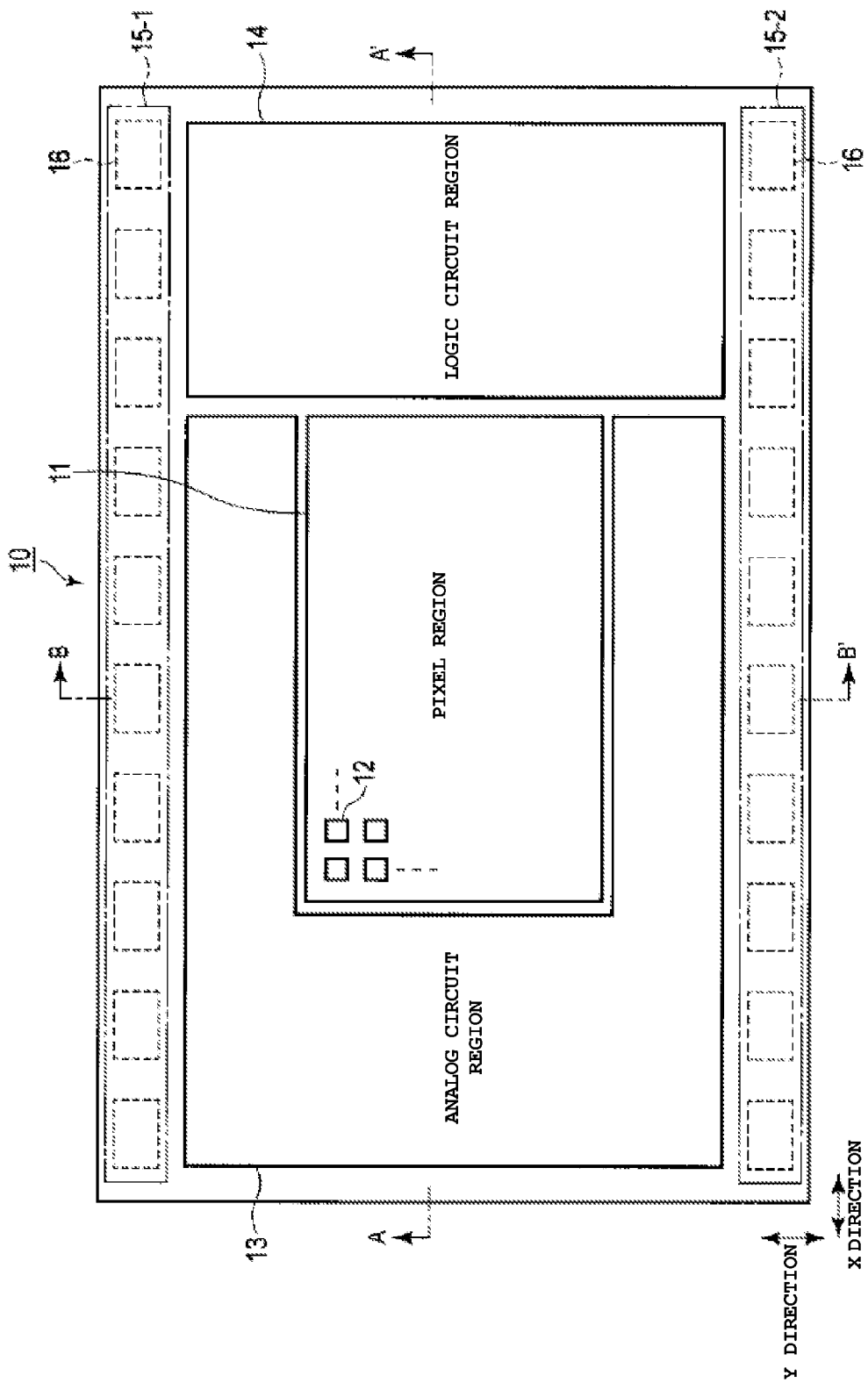
FIG. 1 is a layout diagram of a solid-state imaging device according to a first embodiment.

The embodiments are directed to provide a solid-state imaging device capable of supplying sufficient and stable power to the peripheral circuit, such as the analog circuit and the logic circuit.

Embodiments of the present invention are explained by referring to the drawings. However, the drawings are schematic or conceptual ones, and the dimension and ratio in each drawing are not necessarily the same as the real ones. Several embodiments explained below illustrate devices and methods for materializing the technical idea of the present invention, and the technical idea of the present invention is not specified by the shape, structure, and arrangement, and the like, of the constituent parts described. Furthermore, in the following explanation, the same symbols are used for the elements having the same function and configuration The solid-state imaging device according to the embodiments has a semiconductor element layer, a power supply line to supply an electric power to the peripheral circuit, a first wiring layer to supply the electric power to the power supply line, and a plurality of first through-electrodes. The semiconductor layer has a pixel region in which a plurality of photo diodes are provided and a peripheral circuit region in which a peripheral circuit for processing the device is provided. The power supply line is provided at a first side of the semiconductor element layer in the peripheral circuit region. The first wiring layer is provided at a second side of the semiconductor element layer in the peripheral circuit region. The plurality of first through-electrodes are provided in the peripheral circuit region and pass through the semiconductor element layer between the first side and the second side. At least a part of the first through-electrodes electrically connect between the power supply line and the first wiring layer.

(First Embodiment)

In a first embodiment, a CMOS image sensor having a backside illumination (BSI) structure is exemplified as a solid-state imaging device.

FIG. 1 is a layout diagram of a solid-state imaging device 10 according to the first embodiment. The solid-state imaging device 10 has a pixel region 11 where a pixel array is arranged, an analog circuit region 13 where an analog circuit for driving a pixel array is arranged, a logic circuit region 14 where a logic circuit for controlling the operation of the solid-state imaging device 10 is arranged, and two rows of pads 15 (15-1 and 15-2) to be used for connecting the solid-state imaging device 10 to an external circuit. The peripheral region, such as the analog circuit region 13 and the logic circuit region, includes the circuitry to process the solid-state imaging device 10.

In the pixel region 11, a pixel array having a plurality of pixels 12 (only 4 shown) is arranged. The pixel region 11 is arranged, for example, in the center of the solid-state imaging device 10. The analog region 13 is arranged, for example, so as to enclose three sides of the pixel region 11. The logic circuit region 14 is arranged, for example, adjacent to the side of, in the X direction as shown in FIG. 1, of the pixel region 11. The layouts and sizes of the pixel region 11, the analog circuit region 13, and the logic circuit region 14 can be designed to fit the intended application of the solid state imaging device 10.

The pads 15-1 and 15-2 are arranged in rows at both ends in Y direction, as shown in FIG. 1, of the solid-state imaging device 10. Each of pads 15-1 and 15-2 have a plurality of pads 16 arrayed in a row. To connect the solid state imaging device 10 to a device or external circuit, a bonding wire (not shown in the drawing) is connected to at least one of the pads 16, and the solid-state imaging device 10 is connected to the external circuit via the pad 16 and the bonding wire. Furthermore, the pads 15-1 and 15-2 are shown in phantom on FIG. 1, as they provided on the rear surface of the semiconductor layer (i.e. at light-incident side of the solid-state imaging device 10). The position at which the pads are arranged can be designed appropriately. For example, the pads may be arranged at both ends in the X direction of the solid-state imaging device 10, or the pads may be arranged at four sides (both ends in X direction and both ends in Y direction of the solid-state imaging device 10) of the solid-state imaging device 10.

Figure 2:
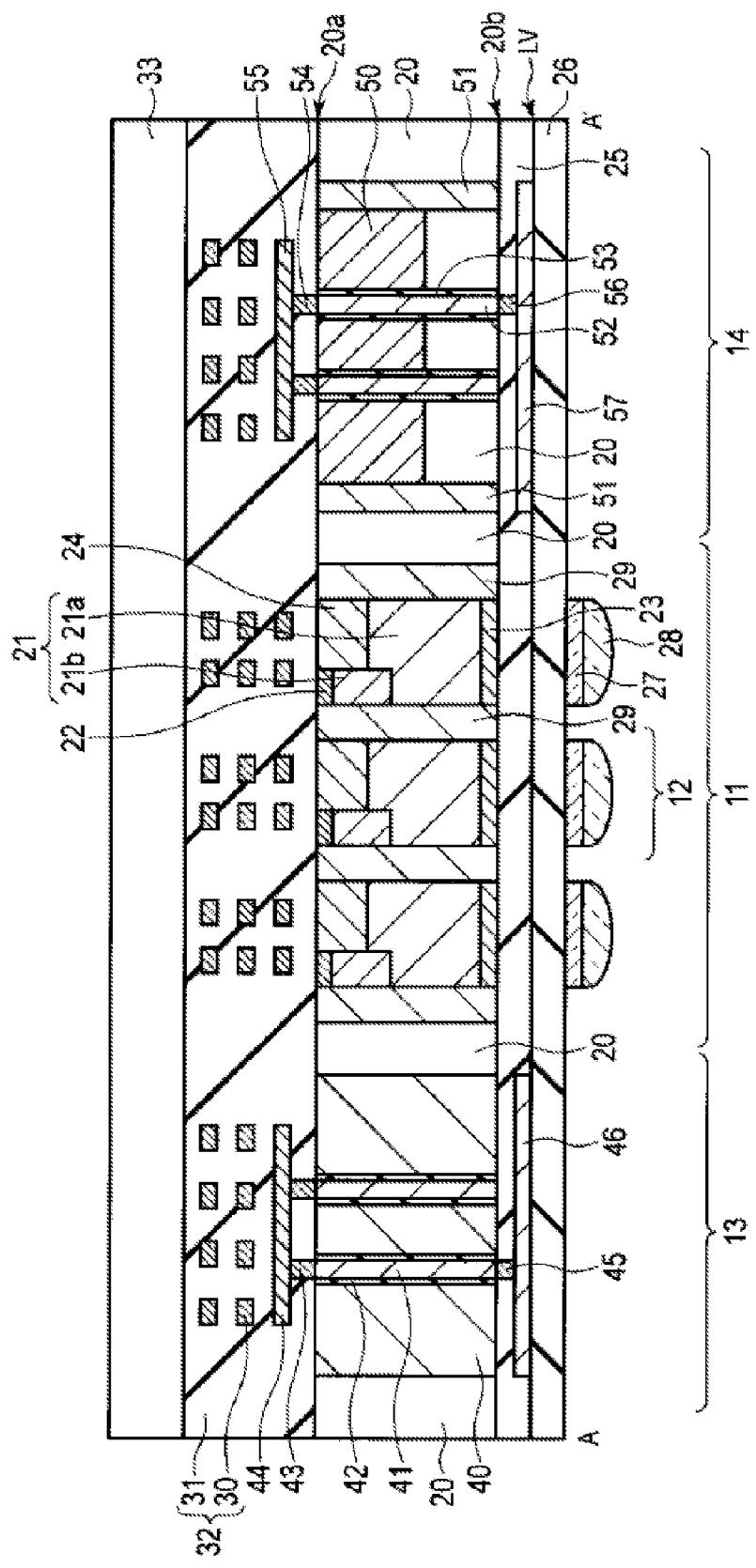
FIG. 2 is a cross-sectional view of the solid-state imaging device of FIG. 1 along an A-A' line.
Figure 3:
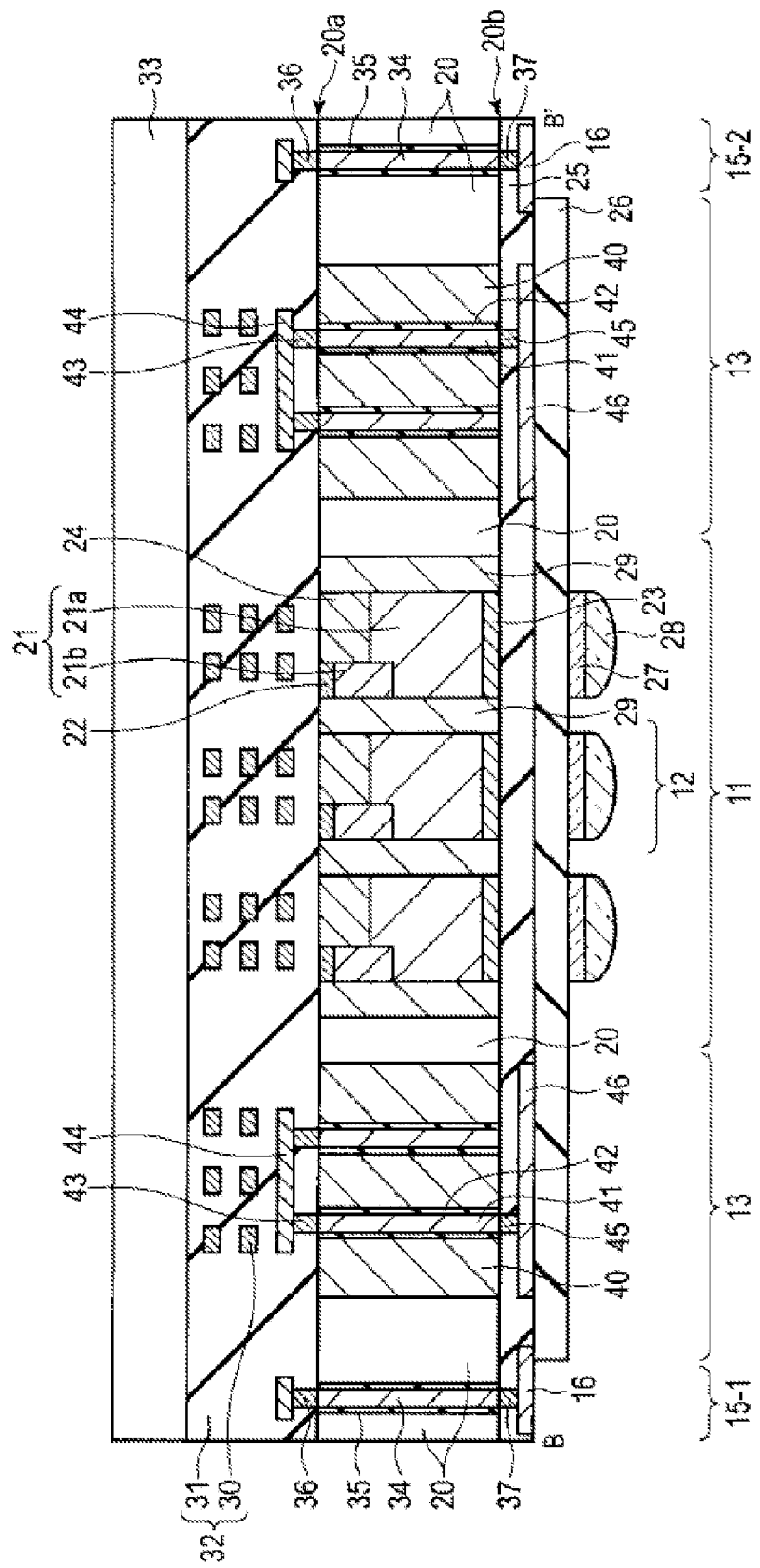
FIG. 3 is a cross-sectional view of the solid-state imaging device of FIG. 1 along a B-B' line.

FIG. 2 is a cross-sectional view of the solid-state imaging device 10 along an A-A' line in FIG. 1. FIG. 3 is a cross-sectional view of the solid-state imaging device 10 along a B-B' line in FIG. 1.

An N-type semiconductor layer 20, where the semiconductor elements are formed, has a first main surface (front surface) 20a and a second main surface (rear surface) 20b. An epitaxial layer made of, for example, silicon (Si) is used for the semiconductor layer 20. A plurality of pixels 12 are provided in the pixel region 11 of the semiconductor layer 20. In FIG. 2 and FIG. 3, three pixels are extracted and shown.

Each pixel 12 has a photodiode 21, shield layers 22 and 23, a color filter 27, a microlens 28, and the like. The photodiode 21 has an N-type semiconductor region 21a, which conducts photoelectric conversion, and an N-type semiconductor region 21b, which accumulates photoelectrically-conversed electric charges. The impurity concentration of the N-type semiconductor region 21b is configured to be higher than the impurity concentration of the N-type semiconductor region 21a. The shield layer 22 is provided on the N-type semiconductor region 21b to prevent dark current. The shield layer 23 is provided at the bottom of the N-type semiconductor region 21a. Each of the shield layers 22 and 23 is comprised of a P-type semiconductor.

A P-type semiconductor region 24 is provided at the first main surface 20a side of the semiconductor layer 20. A floating diffusion layer and MOSFET (not shown in the drawing) included in a pixel 12 are formed in the P-type semiconductor region 24. A transfer transistor for transferring electric charges accumulated in the photodiode 21 to the floating diffusion layer is included in the MOSFET.

An interlayer insulating film 25, which is made of, for example, silicon oxide is provided on the second main surface 20b, and a planarizing film 26, which is made of, for example, silicon nitride, is provided on the interlayer insulating film 25. A plurality of color filters 27 and a plurality of microlenses 28 are provided on the planarizing film 26 so that each color filter 27 and each microlens 28 corresponds to a single photodiode 21.

An element isolation area 29 for electrically separating adjacent photodiodes 21 is provided in the semiconductor layer 20. The element isolation area 29 is composed of a P-type semiconductor. A wiring structure 32 is provided above the first main surface 20a of the semiconductor 20. The wiring structure 32 has wiring layers 30 formed at a plurality of layer levels, and each wiring layer 30 is insulated within an interlayer insulating film 31. A supporting substrate 33 is provided on the wiring structure 32 to reinforce the strength of the solid-state imaging device 10. A silicon substrate and an insulating substrate and the like are used for the supporting substrate 33. The supporting substrate 33 adheres to the wiring structure 32 by an adhesive.

Next, the configuration of the pads 15-1 and 15-2 will be explained. A power supply pad that receives power supply from an external circuit and a pad for passing signals to and from the external circuits, and the like are included in the pads 15-1 and 15-2. As shown in FIG. 3, the conductive pad 16, which is formed within the array of pads 15-1, is provided at the bottom of the second main surface 20b of the semiconductor layer 20. The interlayer insulating film 25 is provided between the second main surface 20b and the conductive pad 16. The pad 16 is electrically connected to a wiring layer in the wiring structure 32 via the through-electrode 34 that penetrates the semiconductor layer 20.

Thus, the through-electrode 34 is provided in the semiconductor layer 20. The through-electrode 34 is surrounded by an insulating film 35 disposed between the electrode 34 and the semiconductor layer 20. One end of the through-electrode 34 is electrically connected to the wiring layer in the wiring structure 32 through a via plug 36. The other end of the through-electrode 34 is electrically connected to the pad 16 through a via plug 37. The configuration of the pads 15-2 is the same as that of the pads 15-1. It is possible to connect a bonding wire, which is used for connection with the external circuit, to the bottom side (i.e., light-incident side) of the semiconductor layer 20 by configuring the pads 15-1 and 15-2 as described above.

(Configuration of Analog Circuit Region 13)

Next, the configuration of the analog circuit region 13 will be explained. As shown in FIG. 2, the P-type semiconductor region 40 is provided at the analog circuit region 13 of the semiconductor layer 20. In the P-type semiconductor region 40, multiple semiconductor elements (including MOSFET) are provided. Furthermore, in this embodiment, a plurality of through-electrodes 41, which penetrate the semiconductor layer 20, are provided in the region where semiconductor elements are not formed of the analog circuit region 13. The though-electrodes 41 are surrounded by an insulating film 42 interposed and isolating the through-electrode 41 from the semiconductor layer 20. The through-electrodes 41 provided in the analog circuit region 13 are used to electrically connect power supply source AVSS to the analog circuits.

Figure 4:
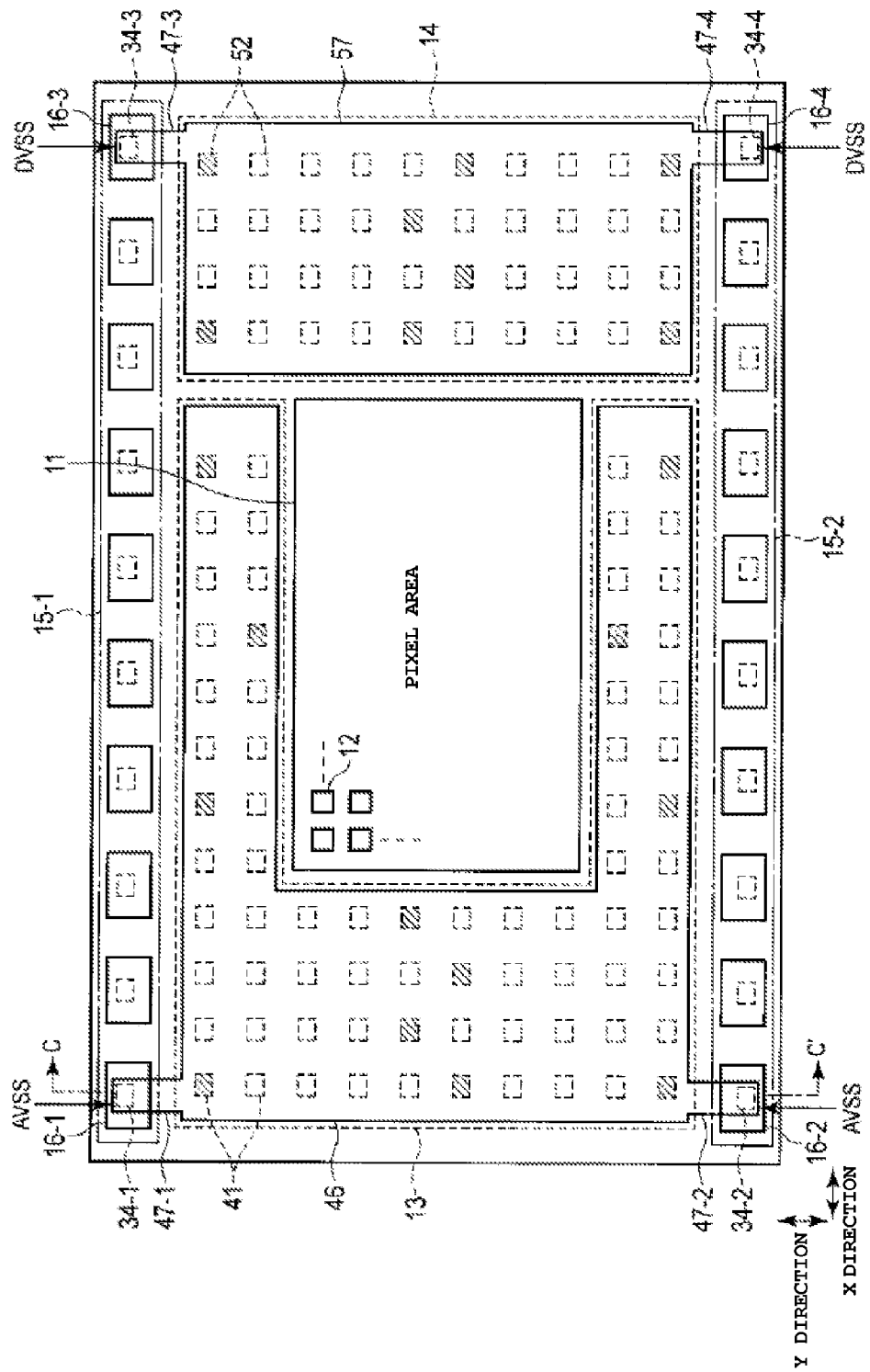
FIG. 4 is a layout diagram of a plurality of through-electrodes for power supply.
Figure 5:
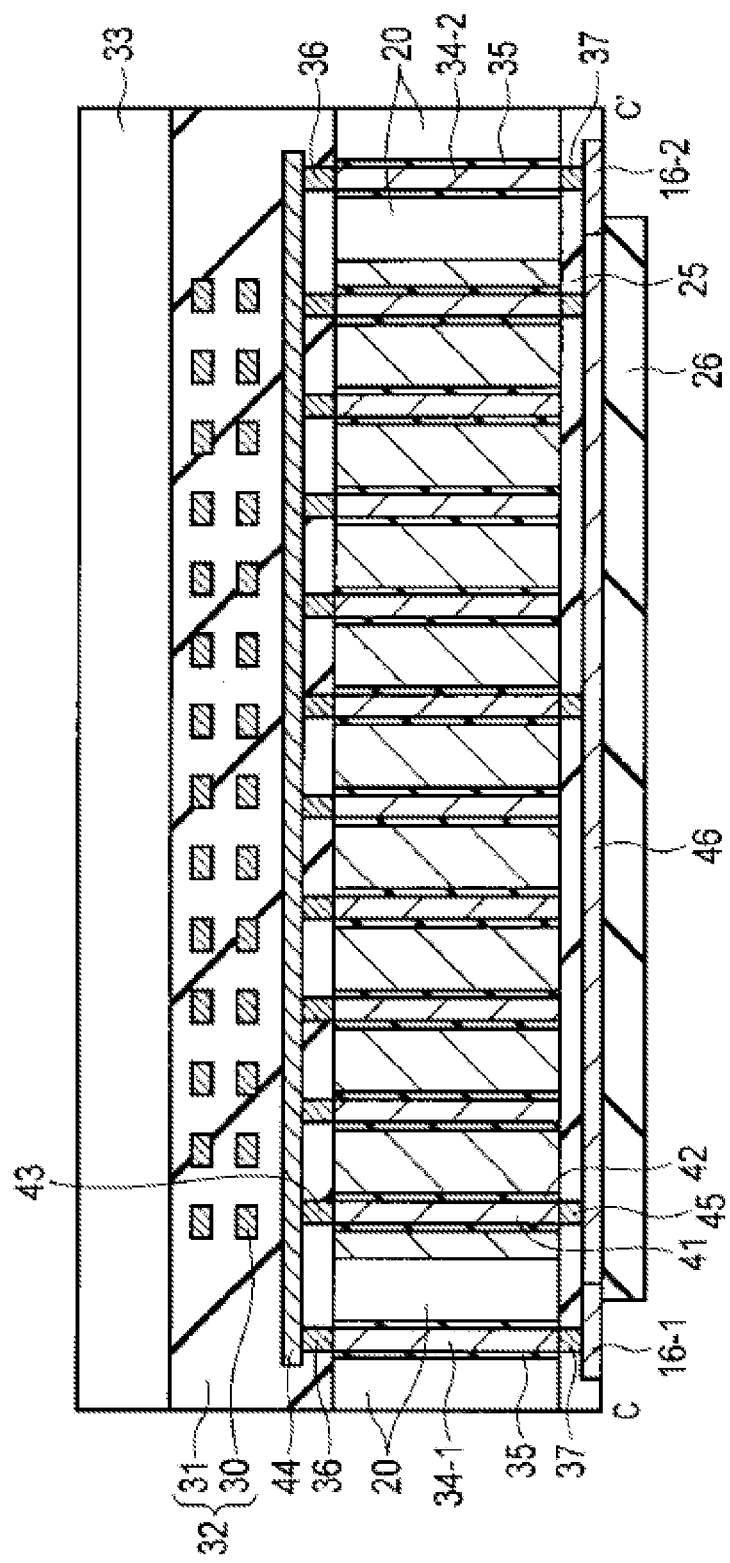
FIG. 5 is a cross-sectional view of the solid-state imaging device of FIG. 4 along a C-C' line.

FIG. 4 is a layout diagram of the positioning of the through-electrodes for power supply, showing the rear side of the solid-state imaging device 10 of FIG. 1. FIG. 5 is a sectional view of the solid-state imaging device along a line C-C' of FIG. 4. As shown in FIG. 4, multiple through-electrodes 41 are provided within in the analog circuit region 13.

Referring to FIG. 5, one ends of the through-electrodes 41 are electrically connected to a power supply wiring buss or layer 44 through via plugs 43 to supply electric power from the power supply source AVSS to the analog circuit. The power supply wiring layer 44 is included in the wiring structure 32. The other ends of the through-electrodes 41 are electrically connected to the wiring layer 46 through via plugs 45. The wiring layer 46 is formed in a planar shape so as to have an almost same size and thereby underlie the analog circuit region 13.

In FIG. 4, the pads 16 to be used to electrically connect the power supply source AVSS to the analog circuits are indicated as 16-1 and 16-2, and the through-electrodes connected to the pad 16-1 and 16-2 are indicated as 34-1 and 34-2, respectively. The pads 16-1 and 16-2 are electrically connected to the wiring layer 46 through the wiring layers 47-1 and 47-2, respectively. The wiring layers 47-1 and 47-2 are formed at the same layer level as the wiring layer 46.

Of all the through-electrodes 41 arranged in the analog circuit region 13, a predetermined number of the through-electrodes 41 are connected to the wiring layer 46. Namely, all of the through-electrodes 41 arranged in the analog circuit region 13 are not connected to the wiring layer 46, but only a part of the through-electrodes 41 are connected to the wiring layer 46. In FIG. 4, for example, only the through-electrodes 41 shown as shaded are connected to the wiring layer 46, and three of these extending electrodes which lay along the line C-C are shown extending to wiring layer 46 in FIG. 5. On the other hand, all of the through-electrodes 41 arranged in the analog circuit region 13 are electrically connected to the power supply wiring layer 44, which is included in the wiring structure 32. Due to this structure, the power supplied from the power supply AVAA to the pads 16-1 and 16-2 can be almost uniformly supplied to the entire analog circuit region 13 by using the wiring layer 46 and a portion of the through-electrodes 41.

The number of the through-electrode 41 to be connected to the wiring layer 46 can be appropriately determined based on the regions which would otherwise experience a large fluctuation of power or a significant voltage drop. Whether the wiring layer 46 is connected to the through-electrode 41 depends on whether the via plug 45 is formed in the interlayer insulating film 25. Namely, in case of connecting the through-electrodes 41 to the wiring layer 46, the via plug 45 may be formed. In case of not connecting the through-electrode 41 to the wiring layer 46, the via plug 45 will not be formed. On the other hand, all of the through-electrodes 41 are electrically connected to the corresponding power supply wiring layer 44 through the via plugs 43. A plurality of power supply wiring layers 44, which are formed as strips of a conductive material, are electrically connected to each other.

Figure 6:
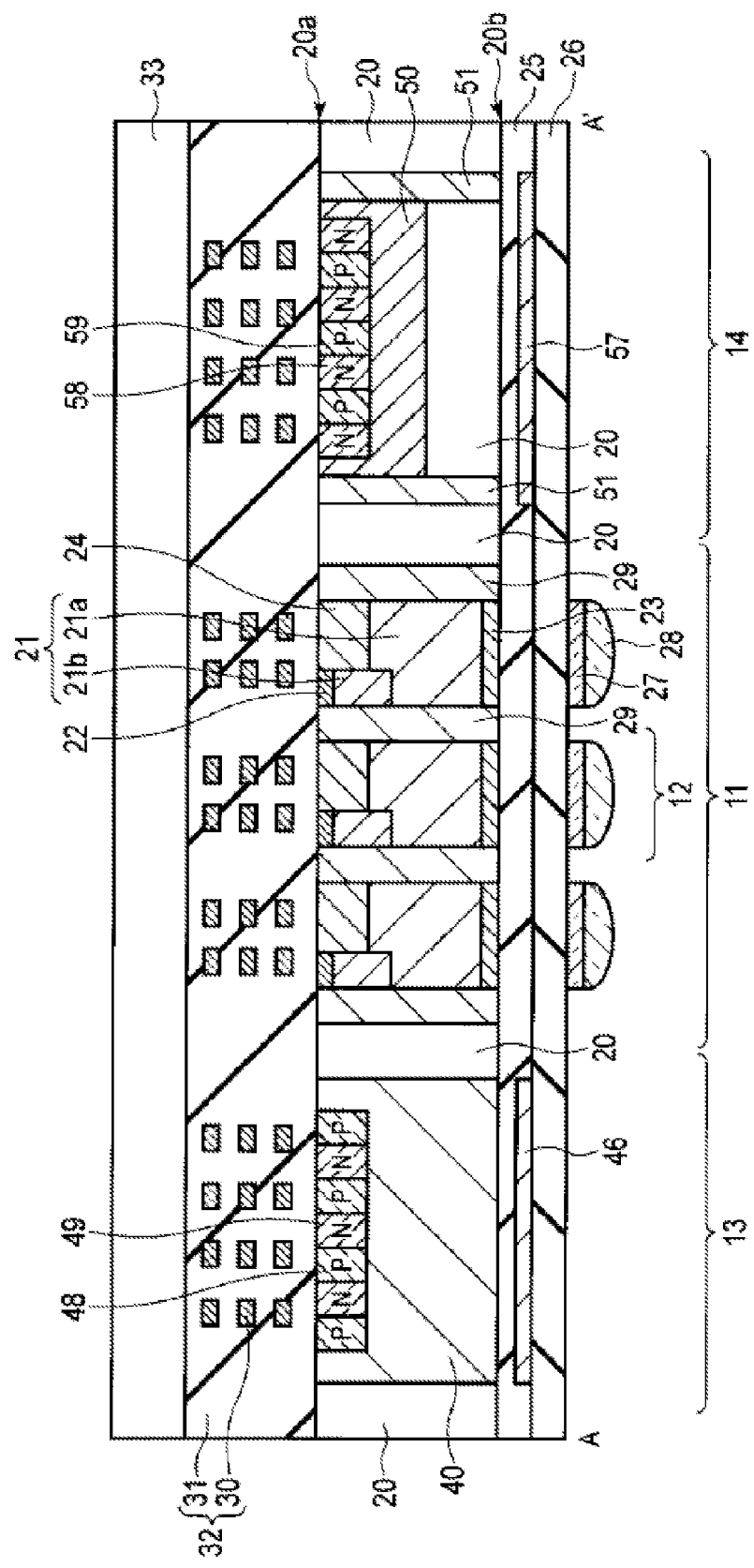
FIG. 6 is a cross-sectional view for explaining a semiconductor element formed in an analog circuit region.

Furthermore, in FIG. 2, only the through-electrodes 41 formed in the analog circuit region 13 are shown, but semiconductor elements are formed in a section where the though-electrodes 41 are not formed in the analog circuit region 13. FIG. 6 is a cross-sectional view of the solid-state imaging device 10 disclosing the semiconductor element formed in the analog circuit region 13. A plurality of P-type semiconductor regions 48 and a plurality of N-type semiconductor regions 49 are provided in the P-type semiconductor region 40 of the analog circuit region 13. N channel MOSFET (not shown in the drawing) is formed in the P-type semiconductor region 48, and P channel MOSFET (not shown) is formed in the N-type semiconductor region 49.

FIG. 2 and FIG. 3 show the configurations of the through-electrodes and the wiring layer in a case in which one power supply source AVSS is connected to the analog circuit. If two or more power supply sources are connected to the analog circuit, the through-electrode and the wiring layer are formed for each power supply source.

(Configuration of the Logic Circuit Region 14)

Next, the configuration of the logic circuit region 14 will be explained. As shown in FIG. 2, a N-type semiconductor region 50 is provided in the logic circuit region 14 of the semiconductor layer 20, and a P-type semiconductor region 51 is provided so as to enclose the circumference of the N-type semiconductor region 50. The P-type semiconductor region 51 is formed so that it extends from the second main surface 20b to the first main surface 20a.

A plurality of semiconductor elements (including MOSFET) are provided in the N-type semiconductor region 50. Furthermore, in this embodiment, a plurality of through-electrodes 52, which penetrate the semiconductor layer 20, are provided in the portion of the logic circuit region 14 where the semiconductor elements are not formed. The through-electrodes 52 are surrounded by an insulating film 53 to isolate them from the surrounding semiconductor layer 20 and n type layer 50. The through-electrodes 52 provided in the logic circuit region 14 are used to supply power from a power supply source DVSS to logic circuits. As shown in FIG. 4, a plurality of through-electrodes 52 are provided in the logic circuit region 14.

One end of the through-electrodes 52 is electrically connected to a power supply wiring layer 55 through via plugs 54 to supply electric power from the power supply source DVSS to the logic circuits. The power supply wiring layer 55 is included in the wiring structure 32. The other end of the through-electrodes 52 is electrically connected to a wiring layer 57 through via plugs 56. The wiring layer 57 is formed in a planar shape so as to have almost the same size as the logic circuit region 14.

In FIG. 4, the pads to be used to electrically connect the power supply source DVSS to logic circuits are indicated as 16-3 and 16-4, and the through-electrodes connected to the pads 16-3 and 16-4, respectively, are indicated as 34-3 and 34-4. The pads 16-3 and 16-4 are electrically connected to the wiring layer 57 through the wiring layers 47-3 and 47-4, respectively. The wiring layers 47-3 and 47-4 are formed at the same layer level as the wiring layer 57.

Of all the through-electrodes 52 arranged in the logic circuit region 14, a predetermined number of the through-electrodes 52 are connected to the wiring layer 57. Namely, all of the through-electrodes 52 arranged in the logic circuit region 14 are not connected to the wiring layer 57, but only a part of the through-electrodes 52 are connected to the wiring layer 57. In FIG. 4, for example, only the through-electrodes 52 shown by the oblique line are connected to the wiring layer 57. On the other hand, all of the through-electrodes 52 arranged in the logic circuit region 14 are electrically connected to the power supply wiring layer 55, which is included in the wiring structure 32. Due to this structure, the power supplied from the power supply source DVSS supplied to the pads 16-3 and 16-4 can be almost uniformly supplied to the entire logic circuit region 14 by using the wiring layer 57 and a portion of the through-electrodes 52.

The number of the through-electrodes 52 to be connected to the wiring layer 57 can be appropriately determined based on the regions having large fluctuation of power supply or significant voltage drop. Whether the wiring layer 57 is connected to the through-electrode 52 depends on whether the via plug 56 is formed in the interlayer insulating film 25. Namely, in case of connecting the though-electrodes 52 to the wiring layer 57, the via plug 56 may be formed. In case of not connecting the though-electrode 52 to the wiring layer 57, the via plug 56 will not be formed. On the other hand, all of the through-electrodes 52 are electrically connected to the corresponding power supply wiring layer 55 through the via plug 54. A plurality of power supply wiring layers 55 are electrically connected to each other.

Furthermore, in FIG. 2, only the through-electrodes 52 formed in the logic circuit region 14 are shown, but the semiconductor elements are formed in the portion, where the through-electrodes 52 are not formed in the logic circuit region 14. As shown in FIG. 6, a plurality of N-type semiconductor regions 58 and a plurality of P-type semiconductor regions 59 are provided in the N-type semiconductor region 50 of the logic circuit region 14. The P channel MOSFET (not shown in the drawing) is formed in the N-type semiconductor region 58, and the N channel MOSFET (also not shown in the drawing) is formed in the P-type semiconductor region 59.

Furthermore, FIG. 2 and FIG. 3 show the configuration of the through-electrodes and the wiring layer in a case in which one power supply source DVSS is connected to the analog circuit. If two or more power supply sources are connected to the analog circuit, the through-electrode and the wiring layer are formed for each power supply source.

(Effect)

As mentioned above, in the first embodiment, the back-illuminated type solid-state imaging device 10 has the semiconductor layer 20 having the pixel region 11 and the peripheral circuit region (analog circuit region 13 and/or logic circuit region 14). The wiring structural member 32 including the power supply wiring layer 44 is provided in the first main surface (surface) 20a of the semiconductor layer 20. The wiring layer 46 formed in a planar form is provided in the second main surface (rear surface) 20b of the semiconductor layer 20 so as to cover the peripheral circuit region. Furthermore, the through-electrodes 41 are provided in the semiconductor layer 20 of the peripheral region. At least a part of the through-electrodes 41 are electrically connected between the power supply wiring layer 44 and the wiring layer 46.

According to the first embodiment, the electric power received by the power supply pad can be supplied to an appropriate place in the peripheral circuit region by using the through-electrodes and the rear surface-side wiring (wiring layer 46). As a result, substantially uniform power can be supplied to the peripheral region. Thus, voltage drop of the supplied power can be reduced at a place distant from the power supply pads, and local fluctuation of the power supply in the peripheral circuit region can be inhibited.

Furthermore, the power supply at any place can be controlled by changing only configurations of the via plugs and the rear surface-side wiring even when the supplied power is needed to be locally increased after the main body portion, i.e. the portion of the device extending between first side surface coa and second side surface 20b, of the solid-state imaging device 10 is manufactured.

Since the through-electrodes 41 that are not connected to the wiring layer 46 are connected to the power supply wiring layer 44, such through-electrodes 41 can be used as a capacitance element (capacitor) or an inductance element (inductor) for the power supply wiring layer 44. Furthermore, the capacitance or inductance of the power supply wiring layer can be determined by determining the number of through-electrodes 41 that are connected only to the power supply wiring layer 44. The number of the through-electrodes 41 to be connected to the power supply wiring layer 44 can be determined by whether the via plug 43 is formed or not. In the logic circuit region 14, the capacitance or inductance of the power supply wiring layer 55 can be determined in the same manner as that in the analog circuit region 13. In addition, the through-electrodes can be used for adding capacitance or inductance to a wiring other than the power supply wiring layer.

(Second Embodiment)

Two signal lines, which are included in the surface-side wiring and arranged separately with each other, can be electrically connected by using the through-electrodes and the rear surface-side wiring. The second embodiment is directed to connect the first signal line and the second signal line, which are included in the surface-side wiring (wiring structural member 32), by using the through-electrodes and the rear surface-side wiring.

Figure 7:
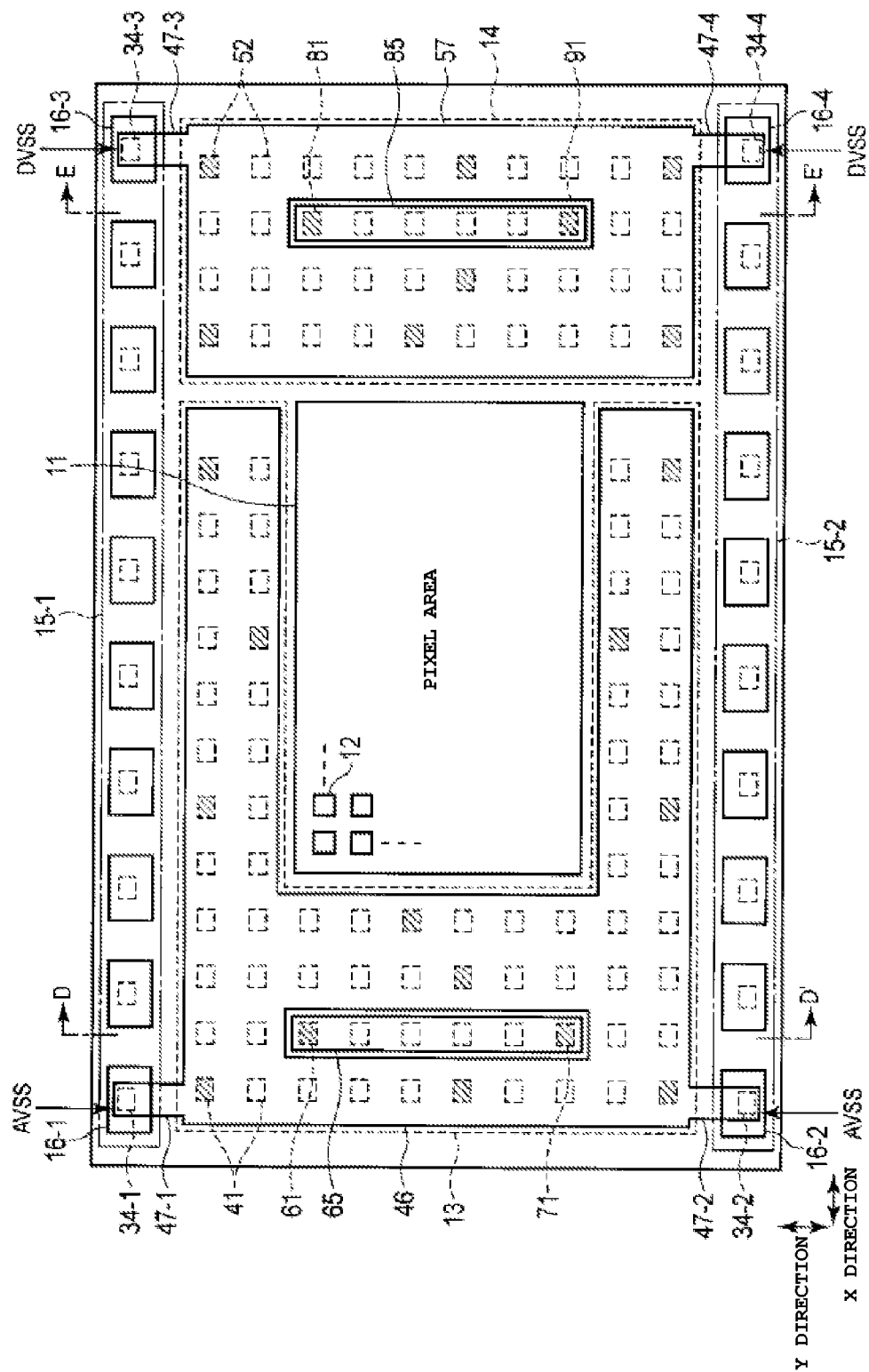
FIG. 7 is a layout diagram of through-electrodes and rear surface-side wirings according to a second embodiment.
Figure 8:
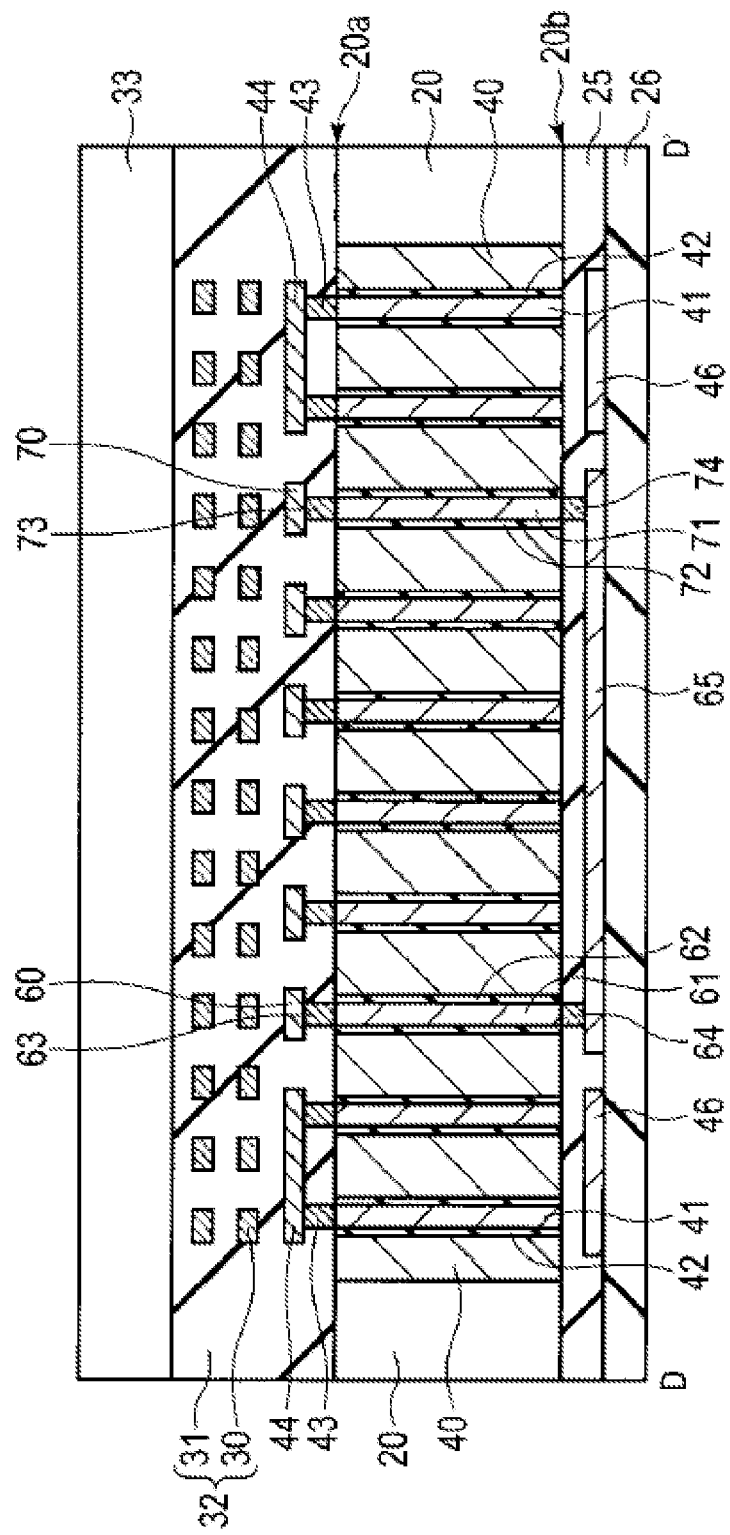
FIG. 8 is a cross-sectional view of the solid-state imaging device of FIG. 7 along a D-D' line.

FIG. 7 is a layout diagram of through-electrodes and rear surface-side wirings according to the second embodiment. FIG. 8 is a cross-sectional view of the solid-state imaging device 10 along a D-D' line in FIG. 7. In this embodiment, it is assumed that signal lines 60 and 70 shown in FIG. 8 are electrically connected. Signal lines 60 and 70 are included in the wiring structure 32 at the analog circuit region 13.

Through-electrodes 61 and 71, which penetrate the semiconductor layer 20, are provided in the analog circuit region 13 of the semiconductor layer 20. Through-electrodes 61 and 71 are arranged in registration with overlying signal lines 60 and 70, respectively. The through electrodes 61 and are surrounded with insulating films 62 and 72, respectively. One end of the through-electrodes 61 and 71 are electrically connected to the signal lines 60 and 70 through via plugs 63 and 73, respectively. The other ends of the through-electrodes 61 and 71 are electrically connected to a wiring layer 65 through via plugs 64 and 74, respectively.

To connect the plugs 64 and 74, and thus the trrogh electrodes 61 and 71, a wiring layer 65 has a length and a width to extend across the gap between the through-electrode 61 and 71. This wiring layer 65 is formed at the same layer level as the wiring layer 46 for power supply. The wiring layer 65 is electrically separated from the wiring layer 46. Due to this structure, the signal lines 60 and 70 of the analog circuit region 13 can be electrically connected through the through-electrodes 61 and 71 and the rear surface-side wiring (wiring layer 65).

Figure 9:
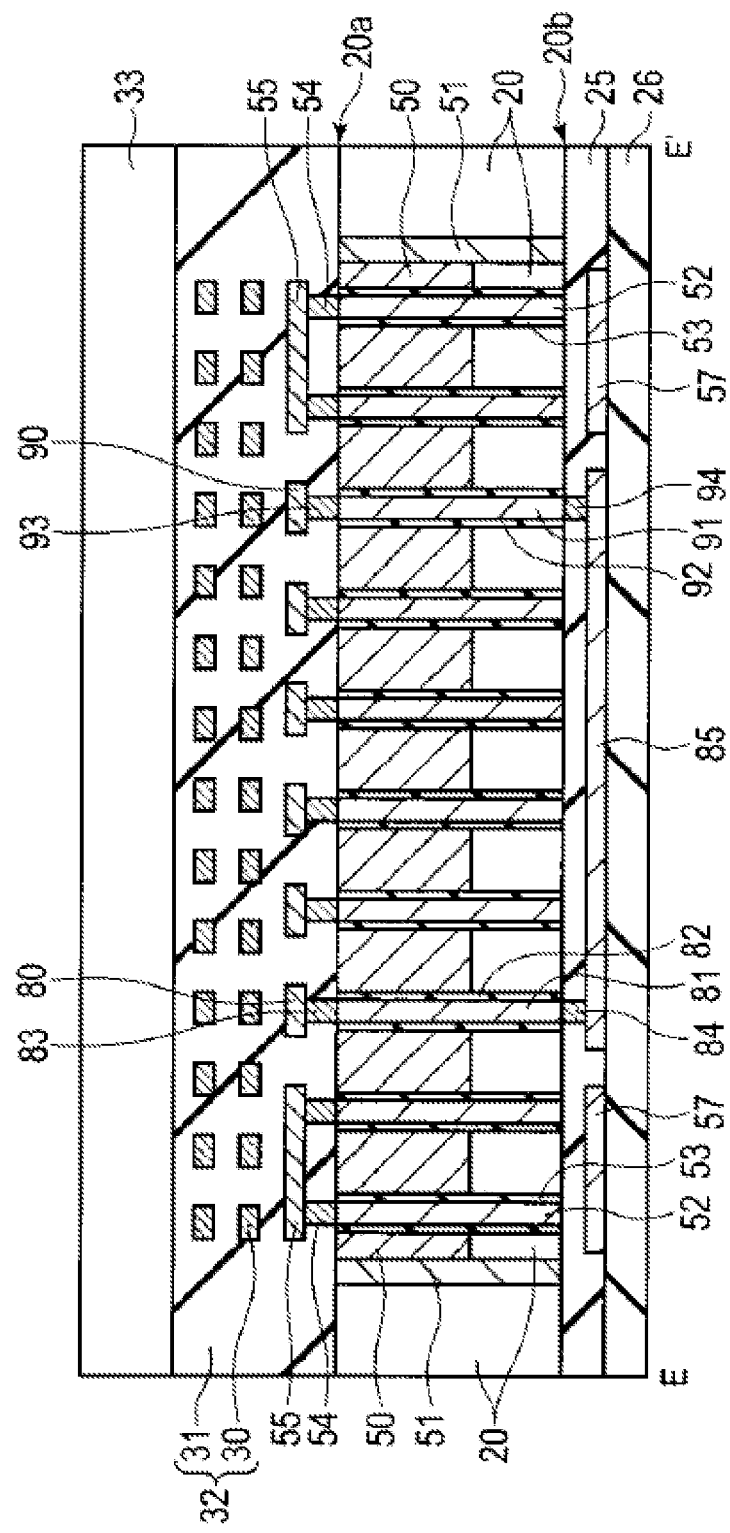
FIG. 9 is a cross-sectional view of the solid-state imaging device of FIG. 7 along an E-E' line.

Next, the structure of the logic circuit region 14 will be explained. FIG. 9 is a cross-sectional view of the solid-state imaging device 10 along an E-E' line in FIG. 7. Signal lines 80 and 90 are electrically connected. The signal lines 80 and 90 are included in the wiring structure 32 of the logic circuit region 14.

Through-electrodes 81 and 91, which pass through the semiconductor layer 20, are provided at the logic circuit region 14 of the semiconductor layer 20. The through-electrodes 81 and 91 are arranged in registration with and underlying the signal lines 80 and 90, respectively. The through-electrodes 81 and 91 are surrounded by insulating films 82 and 92, respectively. One end of the through-electrodes 81, 91 is electrically connected to the signal lines 80 and 90 through via plugs 83 and 93, respectively. The other end of the through-electrodes 81 and 91 is electrically connected to a wiring layer 85 through via plugs 84 and 94, respectively.

The wiring layer 85 has a length and a width for connecting the gap between the through-electrodes 81 and 91. This wiring layer 85 is formed at the same layer level as the wiring layer 57 for power supply. The wiring layer 85 is enclosed with the wiring layer 57 and is electrically separated from the wiring layer 57. Due to this structure, the signal lines 80 and 90 of the logic circuit region 14 can be electrically connected through the through-electrodes 81 and 91 and the rear surface-side wiring (wiring layer 85).

According to the second embodiment, as explained in detail above, the first and second signal lines that are mutually separated can be electrically connected by using the rear surface-side wiring and the through-electrodes. Furthermore, the wiring in the wiring structure 32 does not need to be modified because the rear surface-side wiring can be used. As a result, the congestion of wirings in the wiring structure 32 can be prevented. Therefore, capacitance between wirings can be reduced.

(Application Example)

Figure 10:
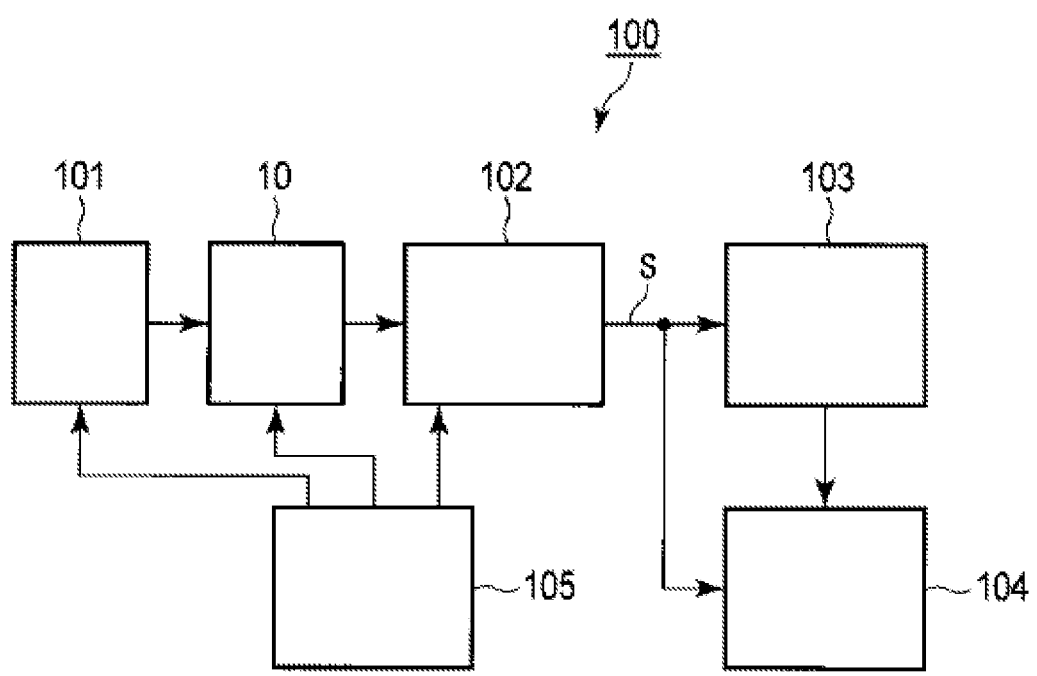
FIG. 10 is a block diagram of a digital camera using the solid-state imaging device according to one of the embodiments.

The solid-state imaging device 10, which has been explained in the first and second embodiments, can be applied to various camera-built-in electronic devices, such as digital cameras and camera-built-in cell phones, and the like. FIG. 10 shows a block diagram of a digital camera 100 using the solid-state imaging device 10 according to one of the present embodiments.

The digital camera 100 has a lens unit 101, a solid-state imaging device (image sensor) 10, a signal processing component 102, a memory unit 103, a display unit 104, and a control unit 105.

The lens unit 101 has multiple imaging lenses and mechanically or electrically controls optical characteristics (for example, focus distance) of the digital camera 100. The light passing through the lens unit 101 is focused on the image sensor 10. Electric signals output from the image sensor 10 are processed in the signal processing component 102. The signal processing component 102 includes DSP (Digital Signal Processor) and the like. The output signal S from the signal processing component 102 is output to the display part 104, or the display part 104 through the memory unit 103. In this way, images on the camera or images captured by the may be displayed on the display unit 104. The control unit 105 controls the operation of the entire digital camera 100 and also controls the operation timings of the lens unit 101, the image sensor 10, and the image processing component 102.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device, comprising:
   a semiconductor element layer having a pixel region in which a plurality of photodiodes are provided and a peripheral circuit region in which a peripheral circuit for processing of signals generated from the pixels is provided;
   a power supply line to supply an electric power to the peripheral circuit, provided at a first side of the semiconductor element layer in the peripheral circuit region;
   a first wiring layer to supply the electric power to the power supply line, provided at a second side of the semiconductor element layer in the peripheral circuit region; and
   a plurality of first through-electrodes, provided in the peripheral circuit region and passing through the semiconductor element layer between the first side and the second side,
   wherein at least a part of the first through-electrodes electrically connect between the power supply line and the first wiring layer.

2. The solid-state imaging device according to claim 1, wherein
   the first through-electrodes are arrayed in the peripheral circuit region at a predetermined distance.

3. The solid-state imaging device according to claim 2, wherein
   at least one of the first through-electrodes are electrically connected to the power supply line at the first side and electrically insulated from the first wiring layer at the second side.

4. The solid-state imaging device according to claim 3, wherein
   the first through-electrodes that electrically connected to the power supply line at the first side and electrically insulated from the first wiring layer at the second side constitute a capacitor or an inductor.

5. The solid-state imaging device according to claim 1, wherein
   the first through-electrodes that electrically connect between the power supply line and the first wiring layer are arranged so that potential of the power supplied to the peripheral circuit is constant over the peripheral region.

6. The solid-state imaging device according to claim 1, wherein
   the first wiring layer is formed in a plane form and covers at least part of the peripheral circuit region.

7. The solid-state imaging device according to claim 1, wherein
   the peripheral circuit region comprises an analog circuit region in which an analog circuit is provided and a logic circuit region in which a logic circuit is provided,
   the first through-electrodes that electrically connect between the power supply line and the first wiring layer are provided in both the analog circuit region and the logic circuit region.

8. The solid-state imaging device according to claim 1, further comprising:
   a power supply pad provided at the second side and at outside of the peripheral circuit region, wherein
   the power supply pads receives the electric power from outside and supplies the received electric power to the first wiring layer.

9. The solid-state imaging device according to claim 1, further comprising:
   first and second signal lines to supply a processing signal, provided at the first side of the semiconductor element layer in the peripheral circuit region;
   a second wiring layer provided at the second side of the semiconductor element layer in the peripheral circuit region; and
   third and fourth through-electrodes provided in the peripheral circuit region and passing through the semiconductor element layer between the first side and the second side, wherein
   the third through-electrode electrically connects the first signal line and the second wiring layer and the fourth through-electrode electrically connects the second signal line and the second wiring layer.

10. The solid-state imaging device according to claim 1, wherein
    the second side is a light incident side of the photodiodes.

11. A method for supplying an electric power to a peripheral circuit of a solid-state imaging device that has a semiconductor element layer having a pixel region in which a plurality of photodiodes are provided and a peripheral circuit region in which the peripheral circuit for processing of signals generated from the pixels is provided, the method comprising:
    supplying the electric power from a first side of the semiconductor element layer to the peripheral circuit;
    supplying the electric power from a second side of the semiconductor element layer to the first side of the semiconductor element layer through a plurality of through-electrodes provided in the peripheral circuit region; and
    supplying the electric power from outside of the peripheral circuit region to the peripheral circuit region at the second side of the semiconductor element layer.

12. The method according to claim 11, further comprising:
    supplying the electric power from outside of the peripheral circuit region and at the second side of the semiconductor element layer to the peripheral circuit through a through-electrode provided at the outside of the peripheral circuit region.

13. The method according to claim 11, wherein
    the electric power is supplied so that potential of the electric power supplied to the peripheral circuit is constant over the peripheral region.

14. The method according to claim 11, wherein
    the peripheral circuit region comprises an analog circuit region in which an analog circuit is provided and a logic circuit region in which a logic circuit is provided,
    the electric power is supplied so that potential of the electric power supplied to the analog circuit is constant over the analog circuit region.

15. The method according to claim 11, wherein
the peripheral circuit region comprises an analog circuit region in which an analog circuit is provided and a logic circuit region in which a logic circuit is provided,
the electric power is supplied so that potential of the electric power supplied to the logic circuit is constant over the logic circuit region.

* * * * *